US009043532B2

(12) United States Patent
Hanhimäki et al.

(10) Patent No.: US 9,043,532 B2
(45) Date of Patent: May 26, 2015

(54) METHOD, DEVICE AND DATA STRUCTURE FOR DATA STORAGE ON MEMORY DEVICES

(75) Inventors: Petteri Hanhimäki, Salo (FI); Ilpo Henrik Järvinen, Pyöli (FI)

(73) Assignee: Nokia Corporation, Espoo (FI)

( * ) Notice: Subject to any disclaimer, the term of this patent is extended or adjusted under 35 U.S.C. 154(b) by 825 days.

(21) Appl. No.: 12/743,905

(22) PCT Filed: Dec. 24, 2007

(86) PCT No.: PCT/IB2007/004083
§ 371 (c)(1),
(2), (4) Date: May 20, 2010

(87) PCT Pub. No.: WO2009/081224
PCT Pub. Date: Jul. 2, 2009

(65) Prior Publication Data
US 2010/0312951 A1    Dec. 9, 2010

(51) Int. Cl.
*G06F 12/00*    (2006.01)
*G06F 13/00*    (2006.01)
*G06F 13/28*    (2006.01)
*G06F 9/445*    (2006.01)
(Continued)

(52) U.S. Cl.
CPC .............. *G06F 12/0246* (2013.01); *G06F 8/65* (2013.01); *G06F 2212/1004* (2013.01); *G06F 2212/1016* (2013.01); *G06F 2212/7202* (2013.01); *G06F 2212/7206* (2013.01); *G06F 2212/7207* (2013.01); *G11C 16/102* (2013.01)

(58) Field of Classification Search
USPC .......................................... 711/103, 154, 170
See application file for complete search history.

(56) References Cited

U.S. PATENT DOCUMENTS

| 5,943,692 | A | 8/1999 | Marberg et al. |
| 2002/0194438 | A1 | 12/2002 | Lasser |
| 2005/0031297 | A1* | 2/2005 | Kaise et al. ............... 386/46 |

(Continued)

FOREIGN PATENT DOCUMENTS

| CN | 1524227 A | 8/2004 |
| EP | 1659497 A1 | 5/2006 |

(Continued)

OTHER PUBLICATIONS

Office Action received in corresponding Chinese Application No. 200780102078.2, dated Sep. 8, 2011, 12 pages.
(Continued)

*Primary Examiner* — Matthew Bradley
*Assistant Examiner* — Rocio Del Mar Perez-Velez
(74) *Attorney, Agent, or Firm* — Harrington & Smith (57) ABSTRACT

A method is provided for storing data on memory devices comprising a plurality of erasable units, wherein the size of said erasable units is an integer multiple of a first integer value, comprising providing a data structure comprising a plurality of data units each including a data unit header, wherein the size of said data units is equal to said first integer value, a plurality of data items and corresponding data item headers within each data unit, associating at least one data unit to each erasable unit, storing said data in said data items and storing data item status information in the corresponding data item headers, and storing data unit status information in said data unit headers.

12 Claims, 3 Drawing Sheets

(51) Int. Cl.
*G06F 12/02* (2006.01)
*G11C 16/10* (2006.01)

(56) References Cited

U.S. PATENT DOCUMENTS

2007/0083697 A1* 4/2007 Birrell et al. ............... 711/103
2007/0260812 A1* 11/2007 Amidon et al. ............ 711/103

FOREIGN PATENT DOCUMENTS

| JP | 2001101071 | 4/2001 |
|---|---|---|
| WO | 9829890 A1 | 7/1998 |
| WO | 2007083697 A1 | 4/2007 |
| WO | 2007100197 A1 | 9/2007 |

OTHER PUBLICATIONS

International Search Report mailed on Sep. 8, for corresponding PCT Application No. PCT/IB2007/004083, 18 pages.
Lim, S. and Park K., "An Efficient NAND Flash File System for Flash Memory Storage," IEEE Transactions on Computers, vol. 55, No. 7, pp. 906-912, Jul. 2006, whole document.
Office Action dated dated Mar. 26, 2012, Korean Application No. 10-2010-7015328, 9 pages.
Office Action dated dated May 23, 2012, Chinese Application No. 200780102078.2, 7 pages.
Extended Search for corresponding European Patent Application No. 07859176.5, dated Jul. 9, 2011, 7 pages.
Office Action for corresponding Korean Patent Application No. 10-2010-7015328, dated Jul. 1, 2011, 5 pages.

* cited by examiner

METHOD, DEVICE AND DATA STRUCTURE FOR DATA STORAGE ON MEMORY DEVICES

RELATED APPLICATION

This application was originally filed as PCT Application No. PCT/IB2007/004083 filed Dec. 24, 2007.

The present invention relates to methods and devices for storing data on non-volatile memory devices. It also relates to data structures for improving the initial programming of such memory devices during manufacture of electronic devices comprising the non-volatile memory devices.

PRIOR ART

Consumer products which have some embedded software usually also include some content for the end user. This content may be music, pictures, applications, end user help notes or even pre-installed settings which help end users using a product. It may also be some data which is used by the product itself. This content and embedded software are usually programmed to a non-volatile memory of the product during manufacture before shipping the product to an end user.

Content is in many cases stored to either a separate memory or to the same non-volatile memory as the embedded software for the product. If an end user can store own content to the non-volatile memory a flash file system is usually needed. In case of read-only content also a read-only flash file system may be used. Irrespective of the particular flash file system solution this content needs to be programmed to the non-volatile memory as fast as possible during manufacture such that manufacture time is not increased too much, because the manufacture time affects the price of the product and mass manufacture capabilities.

Commonly used non-volatile memory technologies used in consumer products include for example NAND, NOR, and Phase Change memories. NAND and NOR memory technologies require special handling through a flash file system because memory cells may only be programmed from logical 1's to 0's. If a logical 0 needs to be changed back to a logical 1 an erase operation is required first. Erase operations are implemented in memory devices in a manner such that each word (16 bits) or byte (8 bits) can not be erased separately. Instead an erasable unit comprises a larger amount of data, usually a multiple of 8 Kilobytes (=1024 Bytes), kB (e.g. 8 kB, 16 kB, 32 kB, 64 kB, 128 kB, 256 kB or 512 kB).

That is, in a worst case scenario overwriting a single word or byte (e.g. 8 bits) would require the deletion of an erasable unit of 8 kB. Naturally this strongly deteriorates the writing speed experienced by the user. In order to allow overwriting of smaller data items and still providing feasible write speeds different kinds of flash file system implementations exist for supporting these previously mentioned memory types. In these file systems the data are arranged such that erase operations are kept at a minimum, which improves the writing performance.

In a very simple example the file system would keep track of the unwritten portions of the flash memory and perform write operations to the unwritten portions first. Only when no unwritten portions are left the file system would perform erase operations in order to render some portions writable again. Generally speaking the file system tries to fill up erased/unwritten portions first before erasable units are erased again.

However, due to the manner data has to be written to flash memories such file system implementations depend strongly on the internal organisation of the memory hardware. This includes the size of the smallest portion that can be erased in a single operation, i.e. the size of the erasable unit. Only if the size of the erasable unit is known beforehand, the file system in the previous simple example can manage the writing and erasing operations suitably. Therefore a conversion is required between an application writing data and the actual physical writing operations, so that a considerable amount of processing is needed. Due to the required conversion the writing is slowed down considerably when compared to writing data using pre-built data images.

Thus during manufacture of a product, for example a mobile phone or other electronic device, programming of the embedded software and/or pre-programmed content into the flash memory strongly affects the manufacture time. Manufacture time should be kept low in order to enhance the throughput which is required for mass manufactures, and also to keep the price of a product at a reasonable level. Therefore the usage of conventional flash file system approaches as described before is not suitable for mass manufacture from the point of view of manufacture speed.

In order to speed up the manufacture pre-generated data images are used to program the embedded software and/or the content into the non-volatile memory. This bypasses the use of the slow flash file system. However, using such data images is adapted to the particular hardware organisation of the flash memory, including the erasable unit size.

It is possible that different types of hardware of non-volatile memory are to be used in a certain product. This may for example depend on a change in the supplier of the memory, using a different hardware type of non-volatile memory or other reasons. Different types of memory, for example Not AND (NAND), Not OR (NOR), Phase Change or Nitrided Read Only Memory (NROM) memories, but also memories of the same type (e.g. NAND) but from different manufacturers or different manufacture batches may have different sizes of the erasable units. With the conventional flash file systems the size of the erasable unit has to be known beforehand, thus strongly reducing the flexibility of the manufacturer of an electronic device. Therefore either only memory types may be used that have the same erasable unit size, or the manufacturer must generate new data images adapted for each memory with another erasable unit size.

It is known to use personal computer (PC) tools which convert data images during manufacture into the needed format (specific for that flash memory device), before programming. This requires that the flash device type is detected before making the conversion. This also ties the PC converter software to the flash file system version used and thus all versions need to be supported by the PC software. To get the required information about the used flash file system and flash memory device in a product in a manufacture environment it is required to start-up the product which consumes extra time.

Different memory types (Multi Level Cell, MLC and Single Level Cell, SLC) and/or memories from different processes (110 nm vs. 90 nm vs. 65 nm) may have different specifications like differently sized erasable units. This makes mass manufacture complicated as pre-generated flash images cannot be used because normally a flash file system handles its own functionality based on erasable unit size. If several erasable unit sizes need to be supported within the same product this entails the need to have several flash images (product content) for manufacture or all writing must be accomplished through the flash file system. Using flash file system in manufacture is slower than using prepared flash images. If an individual image is created for each flash type product the software distribution and maintenance get too complex.

Apparently the known flash file systems are disadvantageous for manufacturers of electronic products, because they either reduce the possible choices of memory types for the product or make the manufacture time-consuming and expensive.

SUMMARY OF THE INVENTION

According to a first aspect of the invention a method is provided for storing data on memory devices comprising a plurality of erasable units, wherein the size of said erasable units is an integer multiple of a first integer value, comprising
providing a data structure comprising
a plurality of data units including a data unit header, wherein the size of said data units is equal to said first value;
a plurality of data items and corresponding data item headers within each data unit;
associating at least one data unit to each erasable unit;
storing said data in said data items and storing data item status information in the corresponding data item headers; and
storing data unit status information in said data unit headers.

The method of storing data according to an embodiment of the invention allows creating single data images for programming memory devices having differently sized erasable units. The data structure suggested by this invention enables one or more data units to be combined into a single erasable unit, wherein each data unit has its own data unit header for storing the data unit status information. This information will be valid for all data units in an erase unit. Therefore file system images using this data structure can be used—without any need for changes or re-generation—for memory devices that have erasable units of sizes ranging from the first value up to higher multiples thereof.

In the simplest case the erasable unit size equals the first integer value. Then only one data unit is contained in each erasable unit. In other examples the erasable unit size equals twice the first value. In this case two data units are combined into each erasable unit. Due to this combination the same file system image as before can be used.

Therefore the invention allows for increased flexibility for the manufacturers of electronic devices comprising memory devices having different erasable unit sizes, because the same file system image (e.g. comprising the embedded software, operating system, pre-programmed content etc.) can be used. If in the same model/type of electronic device (or generally product) another type of memory device shall be used than the one used in the initial production batch, for example due to a change in supplier of the memory devices, this is possible without requiring the generation of a new file system image. This saves time, i.e. increases the throughput of the manufacture line, and offers the manufacturer a much less restrictive choice in the memory devices used in a certain product.

According to an exemplary embodiment said memory devices having a smallest writable unit and the size of said data item headers is an integer multiple of said smallest writable unit.

According to an exemplary embodiment
the size of said erasable units is at least twice said first value;
at least two data units are associated to each erasable unit; and
a single data unit header within each erasable unit is used for storing status information of all data units within the same erasable unit.

This single data unit header can be the first or last (with respect to the memory addresses), or any other designated data unit header, like the second, third data unit header etc. This data unit header will be selected during (e.g. first) start-up of a device using the method for storing data and the data structure according to embodiments of the invention. Only this selected data unit header will be used/updated during further operation of the device. During creation of a data image using the data structure all data unit headers have the respective status information, because in this phase it is not known which one will be the selected data unit header.

However, it is to be noted that in other embodiments of the invention all data unit headers or a sub-set of all data unit headers of an erasable unit may also be used instead of a selected single data unit header.

According to an exemplary embodiment the method comprises
using said data structure for initial programming of one of said memory devices;
reading out the status information of all data unit headers; and
storing status information of all data units within the same erasable unit in a single data unit header within said erasable unit.

In this exemplary embodiment only one data unit header per erasable unit is used to store the status information. The other data unit headers are not used or updated. That is, in the initial file system image all data unit headers comprise valid status information. After initial programming, that is upon first "normal" access of the memory device and later on only a single data unit header, for example the "last" or "first" data unit header in one erasable unit, is used/updated with current status information.

According to a second aspect of the invention a computer program product is provided, comprising program code to instruct a device on which said program product runs to perform a method as described above. In an exemplary embodiment the program code is stored on a computer readable medium.

According to a third aspect of the invention a data structure is provided for storing data on memory devices comprising a plurality of erasable units, wherein the size of said erasable units is an integer multiple of a first integer value, wherein said data structure comprises
a plurality of data units including a data unit header, wherein the size of said data units is equal to said first integer value;
a plurality of data items and corresponding data item headers within each data unit;
wherein at least one data unit is provided for each erasable unit, said data items are adapted to store payload data, said data item headers are adapted to store data item status information, and said data unit headers are adapted to store data unit status information.

According to an exemplary embodiment said memory devices have a smallest possible writable unit, and wherein the size of said data item headers is an integer multiple of said smallest writable unit.

According to a fourth aspect of the invention a memory device is provided, comprising a data structure as described above. According to a fifth aspect of the invention an electronic device is provided comprising at least one such memory device.

According to a sixth aspect of the invention the data structure of the invention is used to program at least two different memory devices comprising erasable units, wherein the size of the erasable units of each memory device is an integer multiple of a first integer value, and wherein the size of the erase units of one of said memory devices is different from the size of the erase units of the other one of said memory devices

BRIEF DESCRIPTION OF THE DRAWINGS

The invention can be more fully understood by the following detailed description of exemplary embodiments, when taken in conjunction with the drawings, which are provided in an exemplary manner only and are not intended to limit the invention to any particular embodiment illustrated therein. In the drawings

DETAILED DESCRIPTION OF THE INVENTION

It is to be noted that the following description will mainly focus on flash memory devices as an example of non-volatile memory devices to which the invention can be applied. However, the invention is not limited to a use with flash memory including but not limited to NOR, NAND, Nitrided Read Only Memory (NROM) and Phase Change memories, but can be used for any non-volatile memory technology that is based on the use of hardware or logical erasable units.

The invention can be applied to memories that do not have hardware erasable units, but that are implemented with a similar logic functionality. For example due to legacy issues, i.e. backwards compatibility, memories not requiring the use of erasable units may though be logically implemented as if they had erasable units. This means that e.g. the erase functionality and/or the erase commands are used in the same manner as in memories with hardware erasable units. The data structure according to embodiments of the invention can be applied to such memories as well. That is, the invention does not require the presence of hardware erasable units, but can also be used for memories being organized with logical erasable units.

Also specific values used in the description of possible embodiments are used in an exemplary manner only, while the invention is not limited to any of the particular values mentioned.

According to exemplary embodiments of the invention a conventional flash file system is not used during the programming of memory devices of end products during the manufacture, which would substantially slow down the programming operation. Instead, the invention provides, according to exemplary embodiments, a data structure with which a flashable image can be created before flashing (i.e. programming) the image to the memory device. Simple programming commands are used to optimally program the data into the flash device.

This image already includes the data item headers of the file system to be used on top of the data structure and the data unit headers, and thus this operation does not need a conventional flash file system anymore. Programming is faster because consecutive addresses can be used for programming the memory device. Programming buffers in the flash device (if any) can be used, even though the programming buffer would not match with the size of the data unit.

During normal operation after the initial programming, e.g. upon first start-up of the end product comprising the memory device, if a data item is to be written the data item is written first and then the corresponding data item header is written thereafter. The data item header is located in a different location, because the data item headers are not included in the date items, and thus the same programming buffer can not be utilized. Also this normal operation can be optimized for speed, and several data items can be written within a single operation, and several data item headers can be updated in a single programming operation. This gives benefits in case the flash memory device has a large programming buffer.

According to exemplary embodiments the invention provides data structures in a manner such that the actual physical layout of non-volatile memory devices has no or only little effect to file system images used for programming in the manufacture of electronic devices. According to embodiments of the invention basic data units of a data structure for non-volatile memory devices can be combined to erasable units of flash memories or the like. The file system and/or the software drive used by the file system must be able to recognize the erasable unit size and support it.

Each data unit comprises several data items and their headers. The data items are provided to store the actual data payload, wherein the data payload can be any kind of data, for example operating system data, multimedia content and the like. The data item headers comprise status information, including information on the validity of the data items.

This may depend on the kind of file system or database is used on top of the software driver. In exemplary embodiments the data item headers will comprise at least the data item number and the validity information of the data item it belongs to. In exemplary embodiments the data unit headers contain data unit validity information and a special marker indicating if there has been an erroneous operation on a particular data unit and/or erase unit of the memory device. Such an operation might be for example an interrupted erase operation.

In the initial data structure used for providing a programming image for storing payload data into an electronic device without using an actual file system, each data unit comprises its own header. Each data unit header comprises valid status information. However, in an exemplary embodiment, after initial programming only one data unit header, e.g. the last/first data unit, holds valid header information in an erasable unit. This embodiment entails that other data unit headers are ignored by a file system used on top of the data structure of the invention, specially when the device comprising it is starting up for the first time or is under normal operation after first start. Status information is only written to/updated in this single data unit header, which may be the first/last or any other particular one of all the data unit headers.

However, it is to be noted that in other embodiments it is also possible to use/update all data unit headers of an erasable unit.

A file system that is used on top of the data structure of the invention is not restricted to any particular type. However, it must be able to use the data items provided by the data structure. The size of the data items is defined by the data structure. In principle the size of the data items is only limited by a smallest writeable unit size of the underlying non-volatile hardware memory. If the physical memory has such a smallest write unit, the data items can be any integer multiple thereof.

The data structure of the invention does not hold the actual file information. This means that the data structure comprises the validity information of data items in the data item headers, but the file system itself holds the file information. That is, the file system keeps track of which data items belong to the same file. Also small data records which will fit to one data item can be stored.

Figure 1:
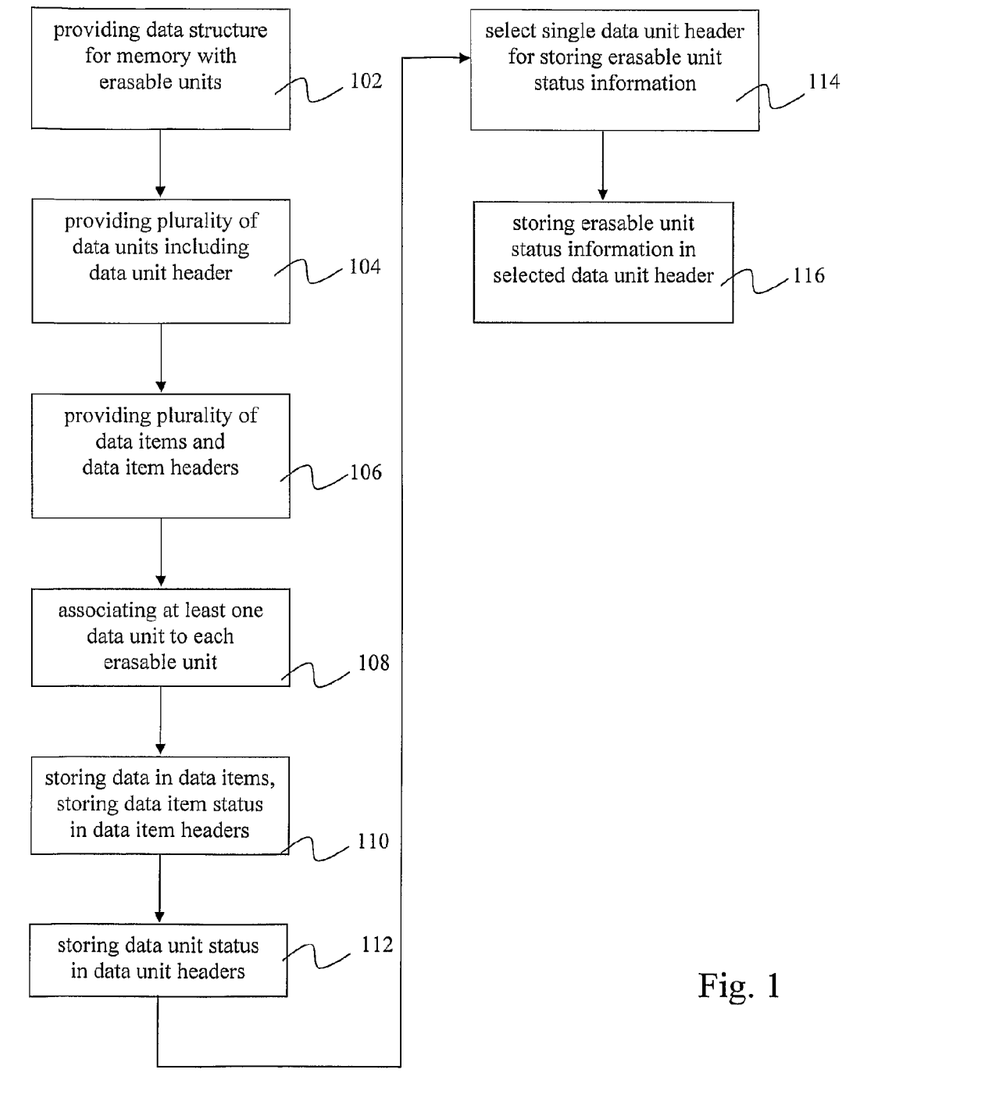
FIG. 1 shows a flow diagram of an embodiment of a method of the invention.

FIG. 1 shows steps of an embodiment of the method of the invention. In step 102 a data structure is provided for a memory device comprising erasable units. The memory device can for example be a flash memory. The erasable units have a size which is an integer multiple of a first value. In the example embodiment shown in FIG. 2 this first value is 64 kB, and the size of the erasable units is 4×64 kB=256 kB. However, these are just exemplary values, other values and integer multiples are possible as well.

The data structure is provided having a plurality of data units including a corresponding data unit header in step 104. The size of the data units is also an integer multiple of the first value. However, the data unit size may be a different integer multiple of the first value than the data unit size, wherein the integer multiple of the data unit size is within the interval from 1 (i.e. then the data unit size is equal to 1× the first value) up to the integer multiple of the erasable unit size. In the example shown in FIG. 2 the integer multiple of the data unit size is 1×64 kB=64 kB. If the erasable unit size is 256 kB, integer multiples like 2×64 kB=128 kB and 4×64 kB would be possible values of the data unit size.

Figure 2:
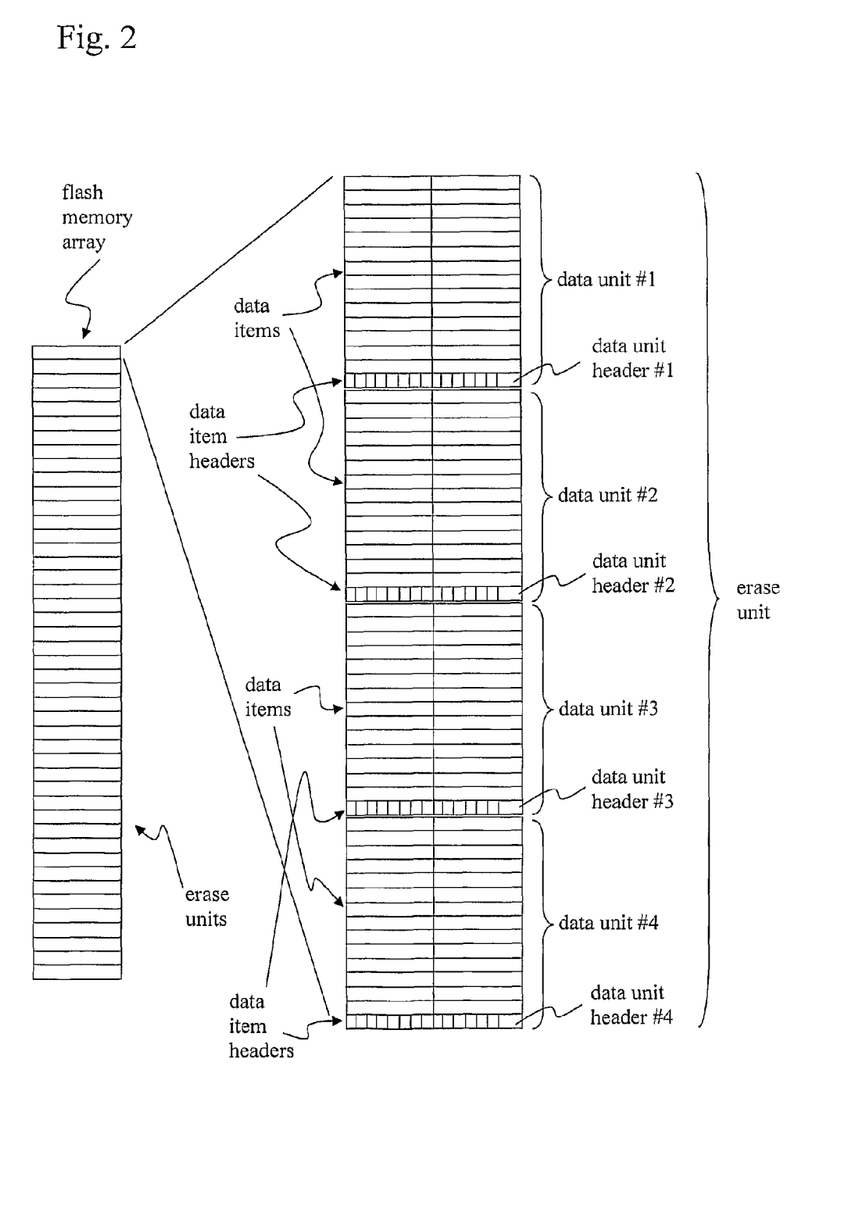
FIG. 2 shows an embodiment of the data structure of the invention.

The data unit headers are part of the data unit. In the example of FIG. 2 the size of the data unit headers is 16 byte. However, this is only an example value. Other values and/or multiples thereof are also possible.

The data structure is further provided to have a plurality of data items and corresponding data item headers, in step 106. The data items are provided to store the actual payload data, while their respective headers indicate the status thereof. In the example of FIG. 2 the data item size is 512 byte. However, other values and multiples are possible as well. The size of the data item header of each data item in this example is 8 byte. In this case the number of data items per data unit is 126. If the underlying flash memories have a smallest writable unit, the size of data item headers must be an integer multiple of the smallest writable unit. Generally all units used in the inventive data structure must then be an integer multiple of the smallest writable unit.

In step 108 at least one data unit is associated to each erasable unit. Again referring to the example of FIG. 2, in this case, four data units (64 kB) are associated to each erasable unit (256 kB). It is to be noted that each data unit has its own data unit header, i.e. there is a total of four data units headers present in each erasable unit in this case.

In step 110 payload data is stored in the provided data items, while the corresponding status information is stored in the respective data item headers. That is, payload data is split up into portions of the size of the data items and then stored therein. The data structure itself does not hold information enabling an entity accessing the data structure to merge or restore the split up data. This task has to be accomplished by an overlying file system which keeps track of the associations of data items to files.

The data structure itself holds the validity information about the data items. In step 112 data unit status information comprising the validity information is stored in the data unit headers.

The data structure provided in this manner can be used as an image to program memory devices of different types now, provided the erasable unit size is an integer multiple of the first value. In case the underlying memory has a smallest write unit, this has to be taken into account as well. Referring again to the example of FIG. 2, the provided data structure can be used to program flash memories having erasable unit sizes of 64 kB, 128 kB, 256 kB or any higher multiple of 64 kB. The flash image must only be generated once and can then be used to program such different memories without a need for regeneration.

It is to be noted that, depending on the ratio of data unit size and erasable unit size, there can be more than one data unit header per erasable unit. In such case, after the initial programming has been made, according to embodiments of the invention only a single data unit header can be used to store the status information relating to the whole erasable unit. Upon first start-up of a device comprising a memory device with the data structure of the invention the other data unit headers are ignored in these embodiments. Only the chosen single data unit header is used and/or updated during further use of the memory device. This single data unit header can for example be the last or first (with respect to the memory addresses) or any other designated data unit header (second, third etc.).

It is to be noted that other embodiments include the use of all data unit headers of an erasable unit, not only a single data unit header. It is included in the invention to use a sub-set of all data unit headers of an erasable unit, i.e. two or more, but not all data unit headers.

Step 112 completes the phase of the provision of the data structure. With the data structure a flash image can be generated with which a product can be pre-programmed with content. It should be noted that the further steps depicted in this figure are optional in some embodiments of the invention. These steps may therefore not be present in other exemplary embodiments.

In step 114 a data unit header is selected for storing erasable unit status information. This step is performed e.g. upon first start-up of a product equipped with a memory device having the data structure. For example the last (with respect to the memory addresses) data unit header is selected. In the further operation of the product the status information of all data units within an erasable unit, i.e. of the erasable unit itself, is then stored in the selected data unit header (in step 116), while other data unit headers within the erasable unit are not used anymore.

In further embodiments of the invention the selection of the data unit header for storing erasable unit status information of step 114 can be repeated later on, and a different data unit header is selected. This can be advantageous in order to provide a kind of wear-levelling of the data unit headers. The re-selection can for example be performed after a certain number of erase operations of the involved erasable unit, or after a certain number of write operations to a particular data unit header. In this manner wear of the hardware flash memory can be distributed between all data unit headers.

In other exemplary embodiments more than one data unit header is selected for storing data unit status information. In still other embodiments no selection is made at all, meaning that all data unit headers of an erasable unit are used to store the erasable unit/data unit status information.

An example data structure as suggested by the invention can be seen from FIG. 2. It is to be noted that the figure may not be in scale, in order to improve the intelligibility. It is just to be understood as an illustrative example. This includes inter alia that the number of data items may not correspond to the number of data item headers, and that the numbers of data items and data item headers may not correspond to the exemplary size values of data units and erasable units. Numbers and dimensions in the figure are not to be construed as limiting the present invention.

If it is assumed that a flash memory has 256 kB (kilobyte) erasable units, the exemplary embodiment shown here may comprise four 64 kB (i.e. 64×1024=65536 byte) data units #1, #2, #3 and #4 in each erasable unit. Each data unit has 126 data items of 512 bytes. Each data item has an 8 byte data item header which holds the status information of the respective data item. 16 bytes remain that are used for data unit status information, i.e. the data unit header has a size of 16 byte. It should be understood that in other embodiments these exemplary sizes can be other multiples of this example.

Each data unit header holds information about erasable unit usage (erasable unit write/erase counter), erasable unit/data unit validity (is the unit erased properly, can it be removed etc.). When used by the software of a product or electronic device, this validity refers to the erase unit validity.

If the underlying hardware flash memory has a limitation with respect to making small writing operations, i.e. data can only be written in portions equal to a smallest value, the data item header size can be adjusted accordingly. This adjustment or definition must be made before generating the data to be contained in the flash image and the flash image itself. For example the actual file system to be used on top of the data structure has to be chosen/adapted to the data item and data item header size.

A software or file system may be used which allows even smaller write operations, wherein this software or file system pre-buffers these smaller write operations in a Random Access Memory (RAM) before actually writing them to the memory device.

The same structure as explained in FIG. 2 can still be used in a product even though it has been equipped with a flash memory with 128 kB erasable units, without changing the flash image. In that case only two data units will be stored in/associated with each erasable unit. For example, in some proposed flash memory devices it has been suggested that the erasable unit size will be 128 kB or a multiple of that. This may include 128 kB and 256 kB erasable units, but devices with 512 kB erasable units or any other multiple are possible as well.

In such an environment with 128 kB erasable units in an exemplary embodiment there would be provided two data units for each 128 kB erasable unit. Inside those data units there are located data items (e.g. sectors, which can be 512 bytes or a multiple of that). These data items can be located anywhere inside the data structure, partitions of which comprise several erasable units.

As every erase operation that is required due to a write operation will cause wear in a flash memory, it is preferred that a kind of so-called wear levelling is performed. That means that data is preferably written to different parts of the memory device in order to wear the memory device more uniformly. Therefore the same data item can also exist in the same data unit at several locations, wherein only the last one/newest data item is valid.

According to exemplary embodiments of the invention all data units have their own data unit header. However, during use of the data structure only that data unit which is last (or first or some other designated data unit) for that specific flash memory is used/updated by a system accessing the memory. In the example of FIG. 2 data unit header #1 or data unit header #4 could be used. There can be different kinds of areas in the data unit which are specific for the usage, i.e. data items for the payload data, data item headers for the corresponding status information, and data unit headers for data unit/erase unit status information.

The data unit header in a physical block comprises the block status information. That data is also present in other data unit headers in that physical block but it is not updated later on, i.e. after the initial programming, and it is not needed anymore during further use of the memory device. Several statuses are stored in each data unit header and thus several write operations are needed. Therefore the memory device has to support writing operations to the data unit header area, or otherwise these several write operations must be pre-buffered in some other memory (like volatile RAM memory) and written to that area later on.

In an example wherein the memory has 256 kB erasable units and wherein the data unit size is 64 kB there would therefore be four data unit headers per erasable unit in total. Three of them (e.g. the first three ones with respect to memory addresses) are not used anymore after initial programming, even though data initially existed in those three data unit headers in the programming image.

From the flash memory usage point of view it would be desired for a specific flash device if data unit size and erasable unit size are equal. This provision, however, requires too much time and effort for mass manufacture of end products including the flash memory to have different images for each particular hardware flash memory type.

Thus, from an end product point of view the data structure of the invention is more cost effective, even though the space of additional data unit headers that are not used in an erasable unit is indeed wasted. However, this waste concerns spaces in the order of 4, 8, 16 or 32 bytes (or multiples, depending the size of the erasable unit) per erasable unit, which for example has a size of 128 kB. Therefore this waste of space can be neglected.

An increased flexibility is gained by using a single flash image that can be (re-) used for end products which are substantially similar but equipped with different types of flash memories, for example flash memories from different manufacturers and/or manufacture batches or even with completely different technologies such as NOR, NAND etc.

Figure 3:
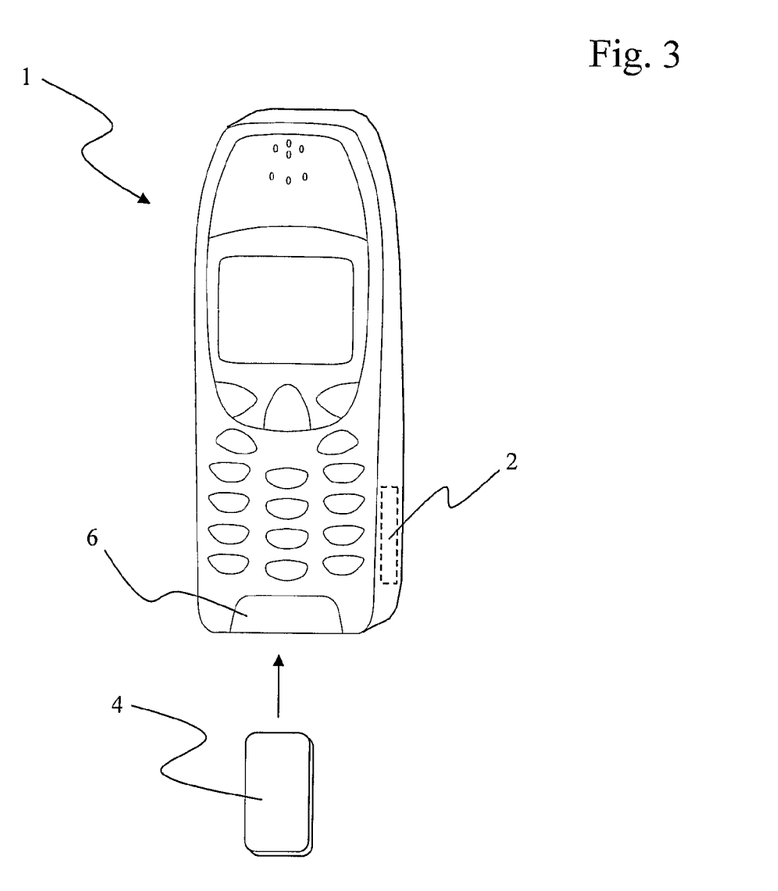
FIG. 3 shows an embodiment of an electronic device and a memory device of the invention.

FIG. 3 shows two further embodiments of the invention. An electronic device 1, for example a mobile phone, comprises an internal flash memory device 2. This flash memory 2 is based on erasable units and comprises a data structure, e.g. similar to the one depicted in FIG. 2, according to an embodiment of the invention. Therefore this mobile phone 1 can be initially programmed using a flash image based on the data structure. The same flash image can be used in similar mobile phones, i.e. of the same model/type, but equipped with another type/production batch or like of flash memory having erasable units of different size.

The figure also shows another embodiment of the invention. A removable media 4, which is an example of a memory device according to an embodiment of the invention, is based on erasable units. The removable media 4 also comprises a data structure of an embodiment of the invention, e.g. a data structure as in FIG. 2. It is possible to use the data structure to generate flash images to program such memory cards with pre-programmed content. Such content may be backup software, multimedia content, encryption software for securing personal data to be stored on the removable media 4, or like. With the same flash image a manufacturer is able to program different types of removable media even if the underlying memory devices have different erasable unit sizes.

Such removable media 4 can for example be used in a mobile phone 1 as depicted here, which has a corresponding media reader 6. The removable media 4 can also be used in any other electronic device being adapted for reading from and/or writing to the removable media 4.

While the foregoing specification is provided to draw attention to those features of the invention believed to be of particular importance it should be understood that protection is claimed with respect to any patentable feature or combination of features referred to and/or shown in the drawings, whether or not particular emphasis has been put thereon. It should be appreciated that those skilled in the art, upon consideration of the present disclosure, may make modifications and/or improvements on the method and device hereof and yet remain within the scope of the invention as set forth in the appended claims.

The invention claimed is:

1. A method comprising:
    programming data on at least one memory device comprising creating a data structure image to program a plurality of erasable units of said at least one memory device, wherein a size of said erasable units is an integer multiple of a first integer value, the method further comprising:
        providing a data structure image comprising:
            creating a plurality of data items each including a data item header, wherein a size of each said data item being equal to said first integer value; and
            creating a plurality of data units each including a corresponding data unit header and at least one data item, a size of each data unit being a third integer value, multiple of said first integer value;
            associating a determined amount of the data units to each erasable unit, the size of each erasable unit being a second integer value, multiple of the first integer value and divisible by the third integer value, wherein said determined amount of the data units associated to each erasable unit is determined based on an amount of the data units that will fit into a smallest possible writeable unit size of the erasable unit associated with the second integer value;
            storing said data in said data items and storing data item status information in the corresponding data item headers;
            storing data unit status information in said data unit headers; and
        using said data structure image to program said plurality of erasable units on said at least one memory device.

2. The method according to claim 1, wherein a size of said data item headers is an integer multiple of said smallest possible writable unit.

3. The method according to claim 1, wherein
    the size of said erasable units is at least twice said first integer value;
    at least two data units are associated to each erasable unit; and
    a single data unit header within each erasable unit is used for storing status information of all data units associated with the same erasable unit.

4. The method according to claim 3, wherein the programming comprises initial programming of said at least one memory device, the method further comprising:
    reading out the status information of all data unit headers; and
    storing status information of all data units associated with the same erasable unit in a single data unit header within said erasable unit.

5. The method according to claim 1, wherein at least one of said data unit header is used to store the status information of all data units within the associated erasable unit.

6. A non-transitory computer program product, comprising program code to instruct a device on which said program product runs to perform a method comprising:
    providing a data structure image to program a plurality of erasable units of at least one memory device comprising:
    creating a plurality of data items each including a data item header, wherein a size of each said data item being equal to said first integer value;
    creating a plurality of data units each including a corresponding data unit header and at least one data item, the size of each data unit being a third integer value, multiple of said first integer value;
    associating a determined amount of data units to each erasable unit, the size of each erasable unit being a second integer value, multiple of the first integer value and divisible by the third integer value, wherein said determined amount of the data units associated to each erasable unit is determined based on an amount of the data units that will fit into a smallest possible writeable unit size of the erasable unit associated with the second integer;
    storing said data in said data items and storing data item status information in the corresponding data item headers;
    storing data unit status information in said data unit headers; and
    using said data structure image to program said plurality of erasable units on said at least one memory device.

7. The non-transitory computer program product of claim 6, wherein at least one of said data unit header is used to store the status information of all data units within the associated erasable unit.

8. A non-transitory computer readable medium embodying a data structure image for programming data on at least one memory device comprising a plurality of erasable units, wherein the size of said erasable units is an integer multiple of a first integer value, wherein said data structure image comprises:
    a plurality of data items each including a data item header, wherein a size of each said data item is equal to said first integer value; and
    a plurality of data units each including a corresponding data unit header and at least one data item, the size of each data unit being a third integer value, multiple of said first integer value;
    associating a determined amount of data units to each erasable unit, the size of each erasable unit being a second integer value, said determined amount of at least one data unit provided for each erasable unit is determined based on an amount of the data units that will fit into a smallest possible writeable unit size of the erasable unit and associated with the second integer;
    said data items being adapted to store payload data,
    said data item headers being adapted to store data item status information and
    said data unit headers being adapted to store data unit status information; and
    using said data structure image to program said plurality of erasable units of said at least one memory device.

9. The non-transitory computer readable medium according to claim 8, wherein the size of said data item headers is an integer multiple of said smallest possible writable unit.

10. The non-transitory computer readable medium according to claim 8, wherein said data structure image is part of a memory device.

11. The non-transitory computer readable medium according to claim 10, wherein the at least one memory device is part of an electronic device.

12. The non-transitory computer readable medium according to claim 8, wherein the size of the erasable units of each memory device is an integer multiple of the first integer value, and wherein the size of the erase units of one of said memory devices is different from the size of the erase units of the other one of said memory devices.

\* \* \* \* \*

UNITED STATES PATENT AND TRADEMARK OFFICE
CERTIFICATE OF CORRECTION

PATENT NO.        : 9,043,532 B2
APPLICATION NO.   : 12/743905
DATED             : May 26, 2015
INVENTOR(S)       : Hanhimaki et al.

Page 1 of 1

It is certified that error appears in the above-identified patent and that said Letters Patent is hereby corrected as shown below:

In the Claims

Claim 6, col. 12, line 12 "creatine" should be deleted and --creating-- should be inserted.

Signed and Sealed this
Eighth Day of September, 2015

Michelle K. Lee
*Director of the United States Patent and Trademark Office*